United States Patent [19]
Glovatsky et al.

[11] Patent Number: 5,102,028
[45] Date of Patent: Apr. 7, 1992

[54] LOCALIZED SOLDERING STATION USING STATE CHANGING MEDIUM

[75] Inventors: Andrew Z. Glovatsky; Robert J. Lynch, both of Endicott; James G. Motto, Jr., Owego; Steve A. Repchak, Endicott; Jean M. Vittone, Appalachin; Lawrence R. Yetter, Apalachin, all of N.Y.

[73] Assignee: International Business Machines Corporation, Armonk, N.Y.

[21] Appl. No.: 725,415

[22] Filed: Jul. 1, 1991

Related U.S. Application Data

[63] Continuation of Ser. No. 503,320, Apr. 2, 1990, abandoned.

[51] Int. Cl.$^5$ ............................................. B23K 1/015
[52] U.S. Cl. ..................................... 228/6.2; 228/105; 228/242; 228/42
[58] Field of Search ............ 228/102, 105, 119, 180.1, 228/191, 240, 242, 264, 8, 42, 56.1, 56.2, 6.2

[56] References Cited

U.S. PATENT DOCUMENTS

| | | | |
|---|---|---|---|
| 4,270,260 | 6/1981 | Krueger | 29/403.4 |
| 4,561,586 | 12/1985 | Abel et al. | 228/264 |
| 4,747,533 | 5/1988 | Lipschutz | 228/180.1 |
| 4,762,264 | 8/1988 | Peck | 228/37 |
| 4,782,991 | 11/1988 | Breu | 228/19 |
| 4,799,617 | 1/1989 | Friedman | 228/180.2 |
| 4,828,162 | 5/1989 | Donner et al. | 228/6.2 |

FOREIGN PATENT DOCUMENTS 192260 8/1987 Japan.

OTHER PUBLICATIONS

"Vapor Phase Solder Reflow for Hybrid Circuit Manufacturing", Spigarelli, Solid State Technology, pp. 50–53, Oct. 1976.

3M Fluorinert Electronic Liquids, Commercial Chemicals Division, 2–1984.

IBM Technical Disclosure Bulletin, "Soldering Tool Employing Hot Vapors", vol. 22, No. 5, pp. 1833–1838, Oct. 1979.

Research Disclosure, "Solder Process Monitor", Kenneth Mason Publications Ltd, England, No. 258, Oct. 1985.

IBM Technical Disclosure Bulletin, ". . . Vapor Phase Soldering Equipment", vol. 30, No. 2, pp. 549–551, Jul. 1987.

IBM Technical Disclosure Bulletin, vol. 13, No. 3, "Solvent Vapor Solder Reflow", Aug. 1970, p. 639; by E. G. Dingman.

*Primary Examiner*—Samuel M. Heinrich
*Attorney, Agent, or Firm*—Douglas M. Clarkson

[57] ABSTRACT

A localized soldering station is described that uses the vapor phase reflow principle. A container has of a medium selected because of the temperature at which it changes to a vapor. A heated conduit maintains the vapor state while conveying the vapor to a work location where a module with a part to be removed or attached by solder connections is supported. A transparent, quartz nozzle confines the vapor to the part and its solder connections and is positioned accurately by a unit that includes a guide light. Vapor will lose its latent heat of vaporization upon contact with the part and its solder connections, causing the solder to reflow and change back to a liquid, which is collected for reuse. When in a standby or ready condition, vapor is conveyed up through a shutoff valve through cooling fins where it changes back to a liquid and returns to the container, avoiding loss.

20 Claims, 3 Drawing Sheets

LOCALIZED SOLDERING STATION USING STATE CHANGING MEDIUM

This is a continuation of Ser. No. 503,320 filed Apr. 2, 1990, now abandoned.

BACKGROUND OF THE INVENTION

1. Field of the Invention

The present invention, generally, relates to apparatus for removing, replacing and attaching electronic components that are soldered in place on a printed wire board or substrate and, more particularly, to apparatus constructed to use a state changing medium having predetermined characteristics.

Typical rework stations available today to remove and to replace surface mounted components on a printed wire board or substrate are constructed to use (1) hot gas, (2) soldering tweezers, (3) hot plate (or hot belt) and (4) lasers. Rework stations using hot gas are the most popular. However, there are major problems with using hot gas, which include very high gas temperature to attain necessary thermal transfer, difficulty in controlling the time/temperature and difficulty in applying a hot gas selectively to only a component to be removed. Damage to a printed wire board or substrate is not uncommon, and with a densely packed surface mounted components and multiple layer printed wire boards today, the cost of such finished modules can easily run into many thousands of dollars.

In today's technology, a substrate includes much more than just a "printed circuit". It is a highly complex product of manufacture that includes interconnecting circuitry for miniaturized packages of electronic components fabricated as individual units, called "integrated circuits", which include usually a large number of solid state devices.

For dense packaging, it is the practice today to use printed wire boards bonded by adhesives to opposite sides of a metallic heat sink. Such structures increase exponentially the problems encountered when it becomes necessary to repair or to replace an integrated circuit component package, such as a leadless chip carrier, without damage to the other components or to the printed wire board.

2. Description of the Prior Art

The idea of using a boiling solvent in some way to facilitate removal and resolder of electronic components was suggested by E.G. Dingman. See IBM Technical Disclosure Bulletin Volume 13, No. 3 dated August, 1970.

U.S. Pat. No. 4,561,586 to Abel et al. issued some 15 years later describing a method of removing an integrated circuit package soldered to a printed circuit board by flowing a heated liquid over the package.

U.S. Pat. No. 4,762,264 to Peck describes a structure using a preheat portion before passing a board with a surface mounted component through a reflow temperature portion.

U.S. Pat. No. 4,799,617 to Friedman describes a heated gas system for removing surface mounted assemblies from a work piece.

U.S. Pat. No. 4,828,162 to Donner et al. describes a structure using heated jaws for gripping and removing an integrated circuit while leaving other components undisturbed.

Notwithstanding the noble efforts of these specialized structural arrangements to overcome the several disadvantages that are inherent in a hot gas system of component removal, industry returns repeatedly to the hot gas system, only because it remains, until the present invention, the most practical means to accomplish the task.

Therefore, it is still a problem to remove a selected component from a substrate without disturbing other components and adjacent parts.

OBJECTS AND SUMMARY OF THE INVENTION

It is a principal object of the present invention to provide a new and improved structural arrangement for a localized soldering station that is both practical and effective in accomplishing the removal and/or mounting of selected components.

It is also an object of the invention to provide a localized soldering station that uses a state changing medium for component removal selectively from a printed wire board or substrate.

Another object of the invention is to provide a localized soldering station that is adapted for the use of a localized vapor phase technique in the repair of surface mounted components.

Still another object of the invention is to provide a system for removing and for replacing leadless chip packages that are attached by soldered connections on a printed wire board or substrate without damage to other components.

Yet another object of the invention is to provide a localized soldering station to use the principle of vapor phase reflow to effect attachment of components to a printed wire board or a substrate.

Briefly, a work station that is constructed and arranged in accordance with the principles of the present invention includes means for containing a supply of a medium that is capable of changing from a first state to a second state, the temperature of the medium in its second state being predetermined, and it also includes means for applying heat to the medium in its first state in order for the medium to transpose into its second state. A work location is provided whereby an electronic circuit module is supported in a predetermined position for the application of the medium in its second state.

These and other objects, features and advantages of the invention will become more readily apparent from the following detailed description of the presently preferred embodiment, taken in conjunction with the accompanying drawings.

DETAILED DESCRIPTION OF THE INVENTION

Figure 1:
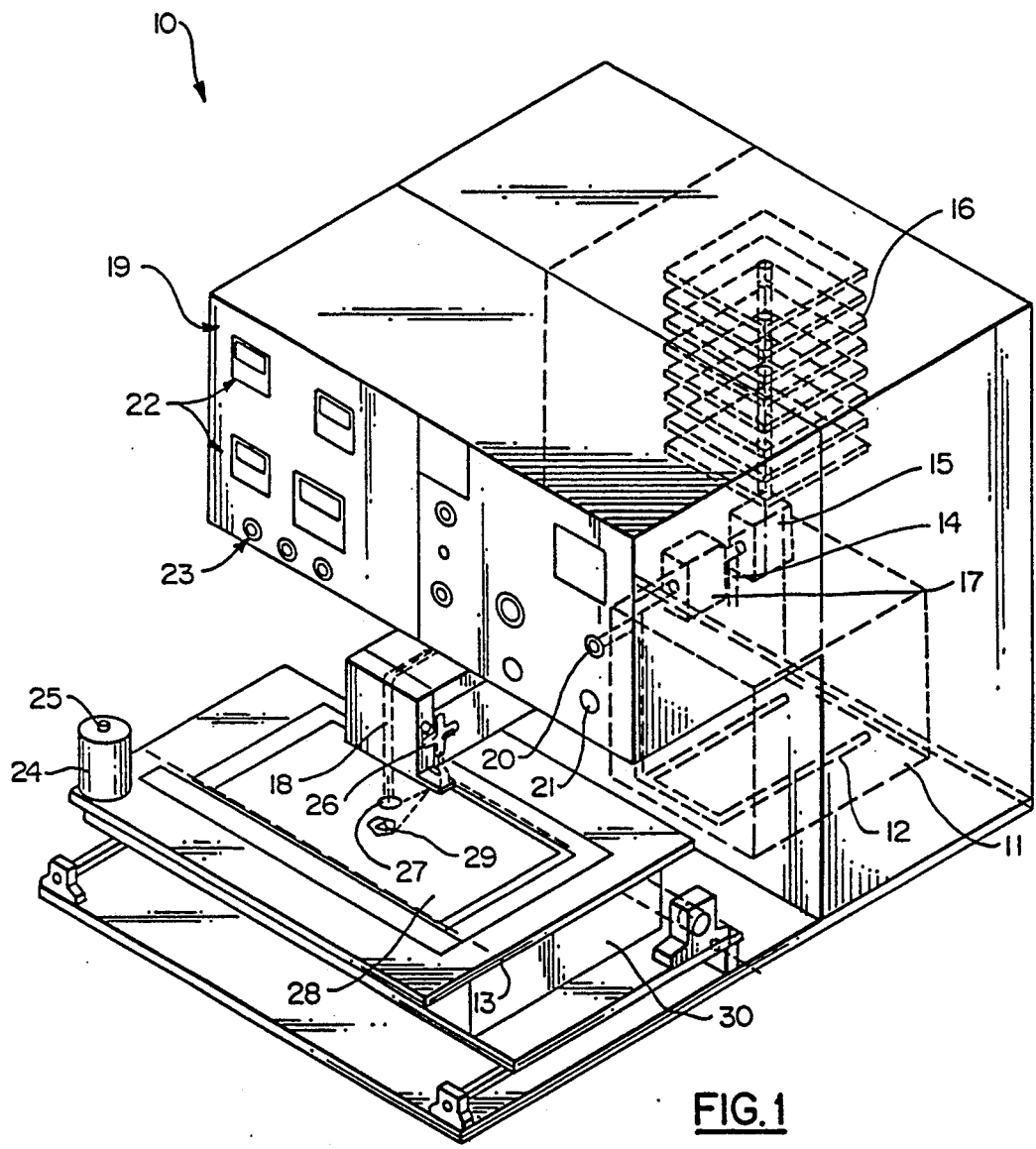
FIG. 1 is a view in perspective of a rework station that is constructed and arranged in accordance with the invention with some of the internal features illustrated in broken lines.

None of the hot gas rework stations available commercially today admit of the features which are obtained by means of the present invention, i.e., that utilize the principle of vapor phase reflow and preselecting a medium according to its temperature of vaporization, which is fixed, stable and known (for a preselected medium). The temperature is fixed in that all fluid mediums vaporize at a temperature that is substantially predictable, and it is stable in that as long as a particular fluid medium boils, its vapor temperature remains constant over a relatively wide range of higher heat applied to its liquid state. Thus, energy can be transferred by vapor and can be made to relinquish its heat through changing back to a liquid upon condensing.

To ensure an unambiguous understanding of the vapor phase reflow principle as it is used in the invention and its difference from the hot gas principle, the following definitions should be established firmly:

fluid—a substance tending to flow or conform in its shape to the outline of its container.
liquid—a substance between solid and gaseous states.
gas—a substance without independent shape or form.
vapor—a substance in the gaseous state, not liquid or solid.
state—a condition of being for a substance.

As used in this description, a substance that changes its state is a fluid that, when heated, changes to a vapor at a known, relatively fixed temperature. It is important for the present invention that, when a medium changes its state, it occurs at a known, relatively definite and fixed, predictable temperature.

The temperature at which a fluid changes its state, i.e., at which it vaporizes, is different for various substances, and therefore, it is important to select a substance that changes its state at a temperature at, or just above, the temperature at which the solder used to attach a component will melt. For the present illustrative embodiment of the invention, an electronic liquid available commercially under the trade name Fluorinert FC5311 is entirely effective. The names "Fluorinert" and "FC" are trademarks of 3M Company. This particular fluid vaporizes at precisely 215° C., and since solder melts at a temperature of 180°-200° C., depending upon its composition, this liquid has been found to be entirely effective.

Before describing in detail the structural form of the rework station of the present invention, early tests were conducted using the Fluorinert FC5311 liquid in this manner in order to prove satisfactory operation of the vapor phase reflow principle with this particular liquid. The Fluorinert FC5311 liquid was put in a flask and heated to its boiling point with a heating mantle. The resulting vapor was transported through a ¼ inch stainless steel tube covered with a heating tape to maintain the temperature above 215° C. (such as, approximately 240° C.) to prevent condensation of the vapor.

The end of the stainless steel tube was fitted with a quartz nozzle formed to match the shape of the component to be removed and formed to a size to fit over the component and the joints of solder by which it was connected. By this means, vapor was applied directly to the component, and as it changed its state back to a liquid, it flowed over the component and the solder connections, causing the solder connections to melt. The component was removed easily by lifting it from its place. Any appropriate means can be used to lift the component, such as tweezers or a vacuum pen with a miniature nozzle.

Since the liquid Fluorinert FC5311 is expensive, the substrate with the component to be removed was held over a shallow pan in order to collect the liquid as it condensed, and since the heat of vaporization, the desired 215° C., was the highest temperature that was obtained, excessively high temperatures were avoided. Also, since the solder joints are readily visible through the clear, quartz nozzle, the lifting of the component can be timed to coincide with the melting of all connections depending upon the printed wire board thermal mass. Due to the carefully sized and dimensioned quartz nozzle, the heating and the resulting reflow is typically 30 to 90 seconds and localized to the component to be removed.

Accordingly, a structure in accordance with the invention is illustrated in the drawings, where the same or similar parts are identified by the same reference numeral in the several Figures.

Referring now more particularly to FIG. 1, the overall rework station of the invention is identified by the reference numeral 10. A stainless steel container 11 is located within the rework station 10 to form a reservoir for a fluid selected for the value of its heat of vaporization. To heat the fluid within the container 11, cartridge heating rods are identified by the numeral 12.

A work location 13 is formed to support an electronic circuit module with a component to be removed or attached, and vapor from the container 11 is carried up through a conduit 14. So that the rework station 10 is always in a condition of readiness to operate and to prevent the development of excessive pressure by the vapor within the container 11, the conduit 14 is connected to a normally open valve 15 to convey the vapor upwardly, past a plurality of cooling fins 16.

By this means, as the vapor rises, it is cooled by the fins 16, and upon cooling, its state changes back to a liquid. By gravity, the liquid now returns to the container 11 for reuse, and since such liquid is expensive, its being vented to atmosphere and being lost is avoided.

However, with a printed wire board or substrate positioned at the work location 13, as will be described in detail presently, the rework station 10 of the invention is ready for operation by merely opening a valve 17 and closing the valve 15 which diverts the vapor from the container 11 to the work location 13 through the valve 17 and through a conduit 18.

Now, in accordance with the presently preferred embodiment, the rework station 10 is operated principally from a front panel 19. For example, by opening and closing a switch 20 on the panel 19 or by a foot switch (not shown), the cartridge heating rods 12 in the container 11 are controlled and made to increase energy to the liquid in the container 11 as needed. An indication of its "on" or "off" status is shown by an indicator lamp 21.

A plurality of temperature indicators/controllers are located on the front panel 19 and are identified by the numeral 22. Any number of electrical switches 23 are located on the front panel 19, depending upon the number of functions to be controlled from the panel.

For example, in the presently preferred embodiment of the invention, a power "on", a power "off" and an "off-on" toggle switch for the vapor transfer conduit are located on the front panel 19. The temperature indicators 22 for the preferred form of the invention are digital, but clearly, this can be varied according to individual preference, if desired.

To describe the work location 13 now in more detail, a handle 24 is positioned at the left front corner of the work location 13 with a thumb actuated brake release button 25. Upon grasping the handle 24 and pressing the brake release button 25, the entire work location 13 can be moved in the x-y plane.

An adjustment in the vertical direction is obtained by rotating a knob 26 to move a quartz nozzle 27 toward and away from a printed wire board or substrate 28. In other words, the work location 13, with its support of the substrate 28, is moveable freely only in the x-y plane, with the brake release button 25 depressed.

An aiming light 29 shines on the component to be removed as an aid in proper positioning of the substrate 28 in the x-y plane. Due to the extremely small dimensions involved, the aiming light 29 is an important feature, and clearly also, it can be as simple or as elaborate as desired or as needed for a particular use.

Another important feature is illustrated by the collection tray 30 that is positioned beneath the substrate 28 to collect run off. When vapor is directed into contact with a component to be removed from the substrate 28, and the vapor condenses around the solder connection transferring its latent heat to the solder, the vapor returns to its first, or liquid, state. It now flows along the upper surface of the printed wire board or substrate 28, over its edges and is collected in the pan 30 for reuse.

Figure 2:
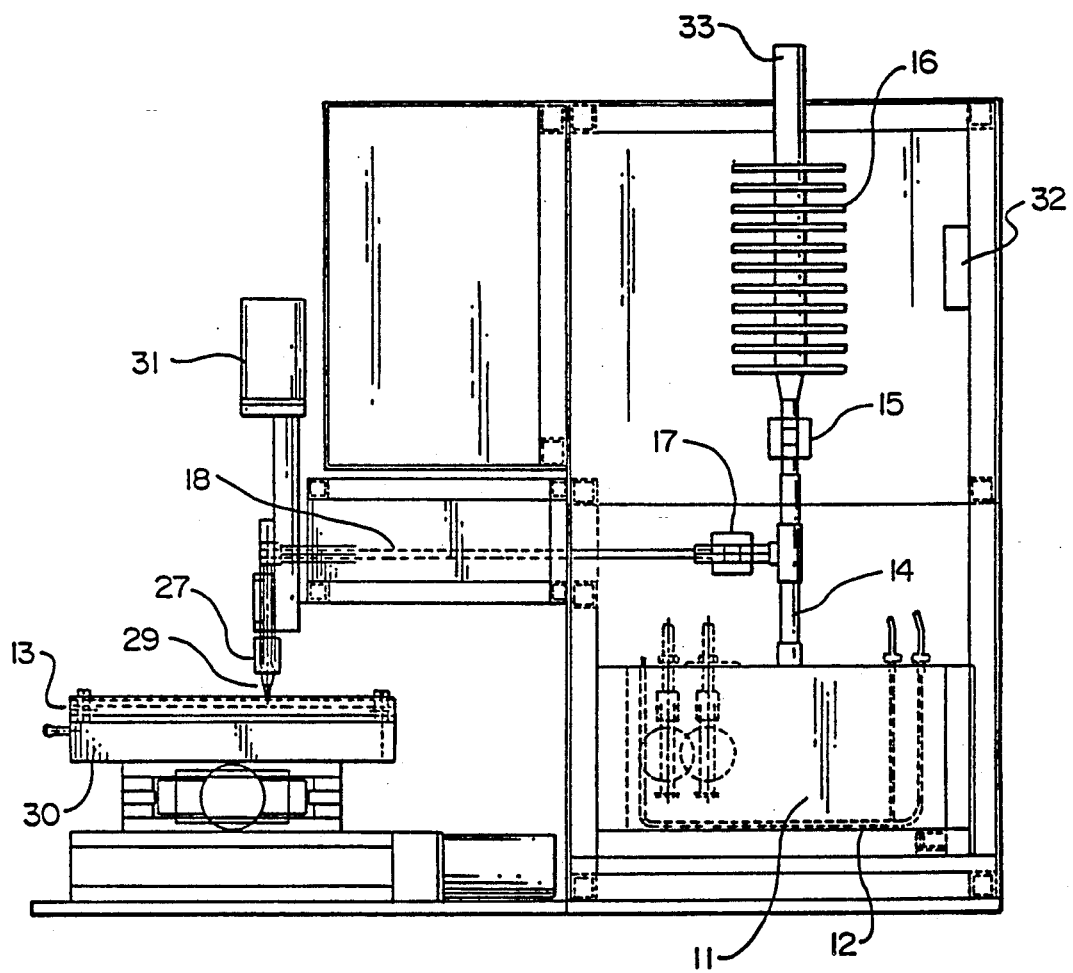
FIG. 2 is a side view in elevation of a rework station that is constructed and arranged in accordance with the invention illustrating further features of the invention.

FIG. 2 of the drawings illustrates better several of the features of a structure in accordance with the invention. For example, the conduit 14 connects heated liquid in its second, or vapor, state straight up through the valve 15 into the cooling fins 16, so that, when the latent heat in the vapor is extracted by the cooling fins 16 returning the vapor to its first, or liquid, state, the liquid falls by gravity back through the vapor, extracting further latent heat from the vapor and increasing the efficiency of this portion of the rework station.

Also in FIG. 2 of the drawings, for positioning the work location 13 and to move the nozzle vertically, instead of the knob 26 as shown in FIG. 1, a computer including the x-y table with z-arm motion, identified by the single reference numeral 31, from the Despensing System, Model LD1000A, (from Automation Unlimited, Inc.) was used successfully here.

It is an important aspect of the invention that the latent heat of the vapor that is being delivered to the quartz nozzle 27 be maintained because otherwise the vapor will condense back to its fluid state. To maintain this temperature, a heating tape is wrapped around the conduit 18, and the heat provided by this arrangement is maintained by the controller 22.

Heat is applied initially to the fluid while it is in the container 11, as described previously in connection with the arrangement of FIG. 1, by the cartridge heating rods 12 to its boiling point, whereupon it changes its state to a second, or vapor, state. The valve 15 being open when the rework station is not in use and the arrangement of the cooling fins 16, permit the rework station of the invention to be in a condition of readiness.

However, while in a busy environment, the condition of constant readiness is a highly desirable characteristic. This poses a situation of potential danger to damage to the localized soldering station should the fluid within the container 11 become depleted.

Therefore, in this modification of the localized soldering station, the temperature of the fluid in the container 11 is monitored constantly by thermal couples connected to visual displays 22. A liquid level sensor provides external monitoring of the liquid by lights and an audible alarm for positive monitoring.

In an environment where the ambient temperature may be too high for convection cooling by the fins 16 alone, a cooling fan 32 is positioned within the same general area as the fins 16 for additional cooling.

Even though the fluid selected to be heated within the container 11 may not be toxic or its vapor otherwise harmful, it is preferred that the upper end 33 of the conduit 14 be connected directly to an exhaust open to the atmosphere externally of the immediate area where the rework station 10 is located.

Figure 3:
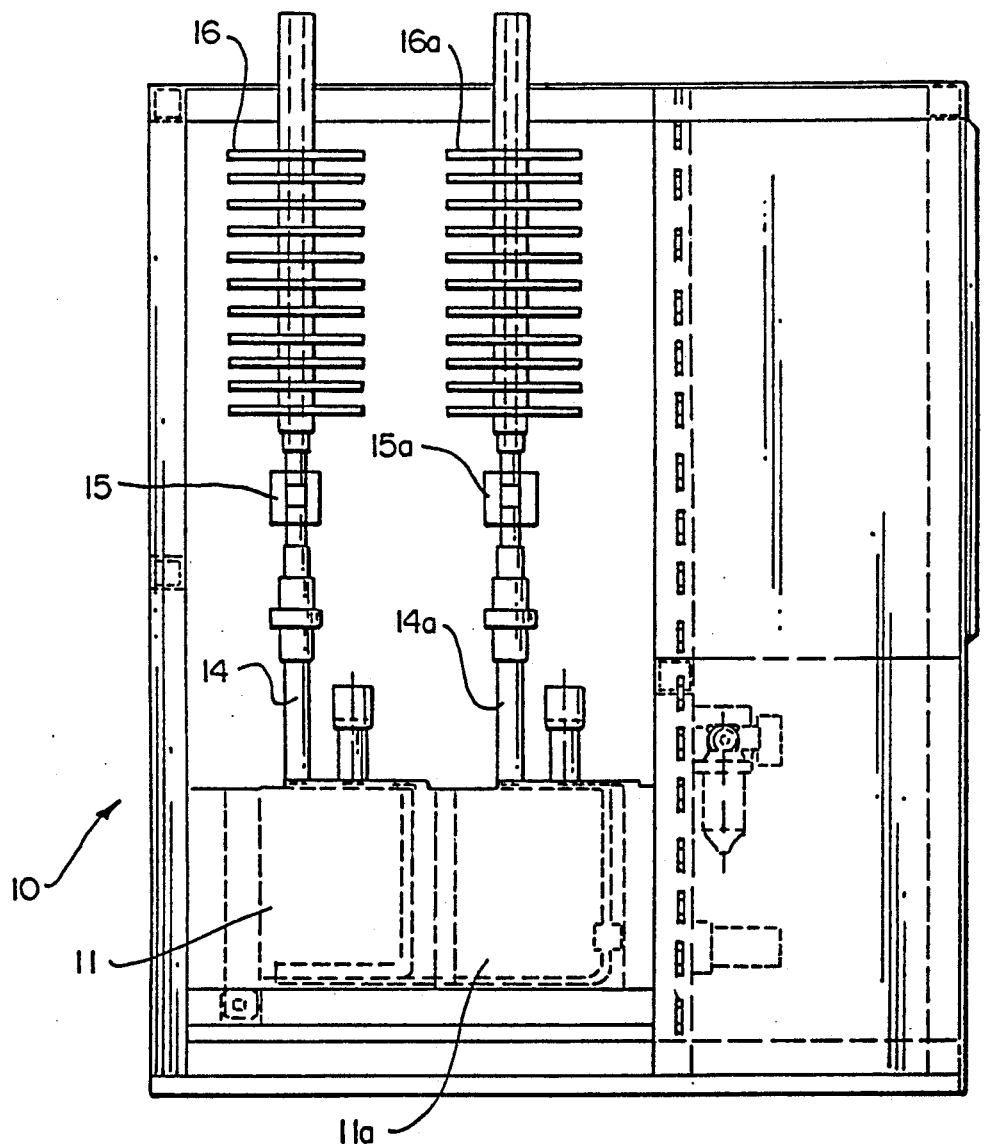
FIG. 3 is a view from the rear of the rework station of the invention illustrating a modification.

FIG. 3 of the drawings illustrates a further modification of the invention. As viewed from the rear, the rework station 10 of the present invention is adaptable for ready use with solders of different melting points, or with adhesives that require elevated temperatures to melt. Multiple containers 11 and 11a are located adjacent one another with vapor conduits 14 and 14a extending side-by-side to similar two-way valves 15 and 15a.

During an interval of non-use, such as a "stand-by" condition, different fluids within the containers 11 and 11a would be boiling and developing vapors. Such vapors are vented upwardly through open valves 15 and 15a and cooled by fins 16 and 16a. Upon changing states, from vapor to fluid, the fluid returns to its respective container, as described previously hereinabove.

In operation. Assume that during the final manufacturing examination, a component on a substrate is identified as needing replacement. A fluid is selected for use in the rework station 10 of the invention depending upon the composition of the particular solder used during manufacture to attach the component to the printed wire board or substrate.

It is the composition of the solder that determines its melting or reflow temperature. A popular and often used solder today melts at approximately 200° C. For this solder, the fluid selected is perfluorophenanthrene (available commercially from 3M as "Fluorinert FC5311"), which boils at 215° C.

The Fluorinert fluid is added to the container 11, and the cartridge heating rods 12 are turned "on". It has been found to take approximately 30 minutes to achieve boiling for approximately two gallons of the fluid, and during this interval, the valve 15 is "open" to avoid excessive build up of vapor pressure in the rework station.

A quartz nozzle is selected to fit closely over the component to be removed, and the selected nozzle is attached to the localized soldering station, as identified by the reference numeral 27 in FIG. 1 of the drawings. Being formed of quartz material, the nozzle 27 permits an operator to view the condition of the solder as the process develops, and when all of the solder connections are melted, the component is lifted from the printed wire board or substrate by any suitable means, such as tweezers, a vacuum pencil, etc.

While the fluid in the container is being heated, an electronic circuit module is positioned on the work location 13 and is adjusted to be directly below the nozzle 27, by grasping the handle 24, depressing the thumb actuated brake release button 25 and moving the work location 13 about until a proper position is achieved. The locating light 29 is helpful in achieving the proper location.

The quartz nozzle 27 is lowered over the component to be removed by turning the know 26. Now, when the valve 15 is closed and the valve 17 is open, vapor moves through the steel conduit 18, while being maintained at its temperature by a heating tape about the conduit 18, to the nozzle 27.

Energy is supplied by the cartridge heating rods 12 to the fluid while the foot switch is activated; thus, generating a constant supply of vapor during reflow.

Upon contacting the surface of the component to be removed and the solder connections holding it in place, the vapor loses its latent heat of vaporization and changes back to its fluid state. The fluid is collected in the pan 30 and returned to the container 11.

The heat transfer from the vapor tot he solder connections, since it is localized, continues until all of the solder is melted, which condition will be clearly visible through the quartz nozzle. After a component is removed, a replacement may be soldered in its place by repeating the above described steps.

While the invention has been illustrated and described with reference to a preferred embodiment and modifications that are preferred in certain circumstances, it is understood that the invention is not limited to this embodiment or to these modifications, but rather, the invention is limited only by the scope of the claims appended hereto.

What is claimed is:

1. A localized soldering station for removing, replacing and attaching electronic circuit components that are soldered in place on a printed wire board with a solder having a melting point at a predetermined temperature, comprising:
   first means for containing a supply of a medium;
   a medium forming said supply in said first means being of a type to change from a first state to a second state at said predetermined temperature;
   second means to apply heat to said medium to cause said medium to generate a supply of said medium in said second state substantially at said predetermined temperature;
   a work location including means to support an electronic circuit module in a predetermined position;
   means to convey said supply of said medium in said second state substantially at said predetermined temperature to said work location;
   valve means connected with said means to convey for interrupting a conveyance of said medium in said second state, to vent said medium when said conveyance is interrupted, and to cool said interrupted medium.

2. A localized soldering station as defined by claim 1 wherein said first state of said medium is liquid and said second state is vapor.

3. A localized soldering station as defined by claim 1 wherein said means to apply heat is adaptable to apply heat at a first temperature, to maintain said medium at its boiling temperature, and to apply heat at a second temperature to generate said supply of said medium in its second state.

4. A localized soldering station as defined by claim 1 wherein said means for containing said supply of said medium includes a stainless steel metal container, and means to convey said medium in said second state includes stainless steel conduit means.

5. A localized soldering station as defined by claim 1 wherein said medium is perfluorophenanthrene.

6. A localized soldering station as defined by claim 1 wherein said means to convey said supply of said medium in said second state includes heating means to maintain said temperature of said second state of said medium.

7. A localized soldering station as defined by claim 1 wherein said work location includes means to confine said medium in said second state to a predetermined part of said electronic circuit module.

8. A localized soldering station as defined by claim 1 including conduit means to convey said medium in said second state from said means for containing, and means for venting said medium in said second state when not in use at said work location.

9. A localized soldering station as defined by claim 1 including means to recirculate said medium in said second state back to said means to apply heat when not being conveyed to said work location.

10. A localized soldering station as defined by claim 1 including nozzle means connected with said work location to confine said medium to a predetermined part on said circuit module.

11. A localized soldering station as defined by claim 1 including stainless steel conduit means to convey said medium in said second state to said work location, heating means connected with said conduit means to maintain said medium in said second state, and valve means with said conduit means to control the conveyance of said medium in said second state.

12. A localized soldering station as defined by claim 1 wherein said medium is perfluorophenanthrene, and said predetermined temperature of said second state of said medium is 215° C.

13. A localized soldering station as defined by claim 1 wherein said predetermined temperature of said second state of said medium is 215° C., and said means to convey includes means to provide approximately 240° C. to maintain said medium in said second state.

14. A localized soldering station for removing, replacing and attaching electronic circuit components that are soldered in place on a printed wire board with a solder having a melting point at a predetermined temperature, comprising:
   first means for containing a supply of a medium;
   a medium forming said supply in said first means being of a type to change from a first state to a second state at said predetermined temperature;
   second means to apply heat to said medium to cause said medium to generate a supply of said medium in said second state substantially at said predetermined temperature;
   a work location including means to support an electronic circuit module in a predetermined position;
   means to convey said supply of said medium in said second state substantially at said predetermined temperature to said work location;
   valve means in a conduit from said supply of a medium to connect said medium in said second state with cooling fins for recirculating said medium back to said supply.

15. A localized soldering station as defined by claim 1 wherein said first state is liquid and said second state is vapor, said means to apply heat is adaptable to apply heat at a first temperature to generate said vapor and at a second, higher temperature to generate said supply of vapor for said work location.

16. A localized soldering station as defined by claim 15 wherein said means for containing said liquid includes stainless steel material, said means to convey includes stainless steel conduit means with heating means to maintain said medium in said vapor state, and said medium is perfluorophenanthrene.

17. A localized soldering station as defined by claim 16 including nozzle means to confine said vapor to a predetermined pat of said electronic circuit module.

18. A localized soldering station for removing, replacing and attaching electronic circuit components that are soldered in place on a printed wire board with a solder having a melting point at a predetermined temperature, comprising:

first means for containing a supply of a medium;

a medium forming said supply in said first means being of a type to change from a first state to a second state at said predetermined temperature;

second means to apply heat to said medium to cause said medium to generate a supply of said medium in said second state substantially at said predetermined temperature;

a work location including means to support an electronic circuit module in a predetermined position;

means to convey said supply of said medium in said second state substantially at said predetermined temperature to said work location;

said first state is liquid and said second state is vapor;

said means to supply heat is adaptable to apply heat at a first temperature to generate said vapor and at a second, higher temperature to generate said supply of vapor for said work location;

said means for containing said liquid includes stainless steel material;

said means to convey includes stainless steel conduit means with heating means to maintain said medium in said vapor state;

said medium is perfluorophenanthrene;

nozzle means to confine said vapor to a predetermined part of said electronic circuit module;

conduit means to convey said vapor from said means for containing said liquid supply; and cooling fin means for converting said vapor not being used at said work location back to liquid for returning to said supply of liquid.

19. A localized soldering station as defined by claim 18 including a transparent nozzle at said work location to confine said vapor to a predetermined part of an electronic circuit module, whereby said vapor changes to a liquid upon contact with said predetermined part, and said liquid flows over said part and its solder connections, causing said solder connections to reflow, and means positioned to collect said liquid, after flowing over said part, for return to said container.

20. A localized soldering station as defined by claim 1 including a plurality of means for containing supplies of different medium with different predetermined temperatures at which said second state is developed, and each of said means for containing supplies being connected with separate cooling means.

* * * * *